United States Patent
Ho et al.

(10) Patent No.: US 7,375,017 B2
(45) Date of Patent: May 20, 2008

(54) METHOD FOR FABRICATING SEMICONDUCTOR DEVICE HAVING STACKED-GATE STRUCTURE

(75) Inventors: Tzu-En Ho, Ilan (TW); Chih-Hao Chang, Taipei (TW); Chang-Rong Wu, Taipei (TW); Kuo-Hui Su, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 160 days.

(21) Appl. No.: 11/338,579

(22) Filed: Jan. 23, 2006

(65) Prior Publication Data

US 2006/0134913 A1    Jun. 22, 2006

Related U.S. Application Data

(62) Division of application No. 10/683,612, filed on Oct. 10, 2003, now Pat. No. 7,022,603.

(30) Foreign Application Priority Data

Jul. 23, 2003    (TW) .............................. 92120045 A

(51) Int. Cl.
*H01L 21/3205* (2006.01)

(52) U.S. Cl. ...................... 438/592; 438/197; 438/682; 438/685; 438/746; 438/761; 257/E21.198; 257/E21.584

(58) Field of Classification Search ................ 438/761, 438/746; 257/E21.198
See application file for complete search history.

(56) References Cited

U.S. PATENT DOCUMENTS

| 6,255,179 | B1 * | 7/2001 | Cantell et al. ............... 438/301 |
| 6,306,743 | B1 * | 10/2001 | Lee ............................ 438/592 |
| 2002/0074584 | A1 * | 6/2002 | Yang .......................... 257/300 |
| 2004/0238876 | A1 * | 12/2004 | Youn et al. .................. 257/315 |

* cited by examiner

*Primary Examiner*—Michael S. Lebentritt
*Assistant Examiner*—Kyoung Lee
(74) *Attorney, Agent, or Firm*—Quintero Law Office

(57) ABSTRACT

A method for fabricating a semiconductor a semiconductor device having a stacked-gate structure. A polysilicon layer is formed overlying a substrate, which is insulated from the substrate by a dielectric layer. A metal-flash layer is formed overlying the polysilicon layer, and then a tungsten nitride layer is formed overlying the titanium layer. The tungsten nitride layer is annealed using nitrogen and hydrogen gases. A tungsten layer and a cap layer are successively formed overlying the tungsten nitride layer.

9 Claims, 3 Drawing Sheets

METHOD FOR FABRICATING SEMICONDUCTOR DEVICE HAVING STACKED-GATE STRUCTURE

This application is a divisional of U.S. application Ser. No. 10/683,612, filed Oct. 10, 2003 now U.S. Pat. No. 7,022,063.

BACKGROUND OF THE INVENTION

1. Field of the Invention

The present invention relates in general to a semiconductor process, and more particularly, to a method for fabricating a semiconductor device having a stacked-gate structure.

2. Description of the Related Art

A semiconductor memory device is typically divided into read/write memory and read only memory (ROM). The read/write memory is also divided into a dynamic random access memory (DRAM) and a static random access memory (SRAM). The DRAM is mainly used in memory applications, wherein a DRAM cell includes an access transistor and a storage capacitor.

Due to rapid development in memory research, the capacity of DRAM has quadrupled every three years. For example, 256 Mb DRAM has been developed, and also various studies on 1 Gb DRAM are in progress.

Currently, a doped polysilicon material is used to form the gate electrode of a semiconductor device, and a tungsten silicide layer is deposited on the doped polysilicon material in order to lower the resistance of the gate electrode. Additionally, in order to increase integration in DRAM, the line width of the gate electrode is reduced to reduce the overall size of a DRAM cell. However, the resistivity of the thin tungsten silicide layer is about 100 $\mu\Omega$·cm, which is too high for use as the gate electrode material. Accordingly, further reduction in the resistance of the gate electrode is required to obtain a device capable of driving DRAM over 1 Gb with fine line width. There have been a number of studies on using tungsten as a gate electrode material, which has a resistivity of about 10 $\mu\Omega$·cm. For example, a tungsten layer is deposited overlying a doped polysilicon layer and a tungsten nitride layer is formed therebetween to create a stacked-gate structure, where the tungsten nitride layer prevents increased resistance in the gate from reaction between the tungsten layer and the doped polysilicon layer. It is, however, difficult to control the resistance of the stacked-gate structure due to the poor thermal stability of the tungsten nitride layer. As a result, the reliability of devices is reduced.

SUMMARY OF THE INVENTION

Accordingly, an object of the present invention is to provide a novel method for fabricating a semiconductor device having a stacked-gate structure, which employs nitrogen and hydrogen gases to anneal the stacked-gate structure, thereby increasing the thermal stability and reducing the resistance of the stacked-gate structure to increase reliability.

According to the object of the invention, a method for fabricating a semiconductor device having a stacked-gate structure is provided. First, a polysilicon layer is formed overlying a substrate, which is insulated from the substrate by a dielectric layer. Next, a metal-flash layer is deposited overlying the polysilicon layer subsequent to cleaning the polysilicon layer. Thereafter, a tungsten nitride layer is formed overlying the metal-flash layer, and then the tungsten nitride layer is annealed using nitrogen and hydrogen gases. Finally, a tungsten layer and a cap layer are successively formed overlying the tungsten nitride layer.

Moreover, the metal-flash layer has a thickness of about 10 to 30 Å and can be a $TiSi_2$, $CoSi_2$, or NiSi layer, which is formed by self-aligned silicide (SALICIDE) process.

Moreover, the tungsten nitride layer is annealed at about 800 to 900° C. for 50 to 100 sec. A flow ratio of nitrogen to hydrogen is about 4:1 to 3:2.

Still according to the object of the invention, a method for fabricating a semiconductor device having a stacked-gate structure is provided. First, a polysilicon layer is formed overlying a substrate, which is insulated from the substrate by a dielectric layer. Next, a metal-flash layer is formed overlying the polysilicon layer subsequent to cleaning the polysilicon layer. Thereafter, a tungsten nitride layer and a tungsten layer are successively formed overlying the metal-flash layer, and then the tungsten layer and the tungsten nitride layer are annealed using nitrogen and hydrogen gases. Finally, a cap layer is formed overlying the tungsten layer.

Moreover, the metal-flash layer has a thickness of about 10 to 30 Å and can be a $TiSi_2$, $CoSi_2$, or NiSi layer, which is formed by self-aligned silicide (SALICIDE) process.

Moreover, the tungsten nitride layer is annealed at about 800 to 1000° C. for 50 to 100 sec. A flow ratio of nitrogen to hydrogen is about 4:1 to 3:2.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 1a to 1e are cross-sections showing a method for fabricating a semiconductor device having a stacked-gate structure according to the invention. First, in FIG. 1a, a substrate 100, such as a silicon substrate or other semiconductor substrate, is provided. The substrate 100 may contain a variety of elements, including, for example, transistors, resistors, capacitors, and other semiconductor elements as are well known in the art. In order to simplify the diagram, a flat substrate is depicted. Next, a dielectric layer 102 and a polysilicon layer 104 are successively formed overlying the substrate 100 by conventional deposition, such as chemical vapor deposition (CVD). In the invention, the dielectric layer 103 can be a silicon oxide layer to serves as a gate dielectric layer, which has a thickness of about 30 to 100 Å and can be formed by thermal oxidation at 700 to 1000° C. Moreover, the polysilicon layer 104 can be a doped polysilicon layer to serve as a base material for a stacked-gate structure, which has a thickness of about 1000 to 2000 Å and can be formed by plasma enhanced CVD (PECVD). Thereafter, a cleaning process can be optionally performed on the surface of the polysilicon layer 104 by, for example, diluted hydrofluoric acid (DHF), to remove the native oxide formed thereon.

Figure 1A:
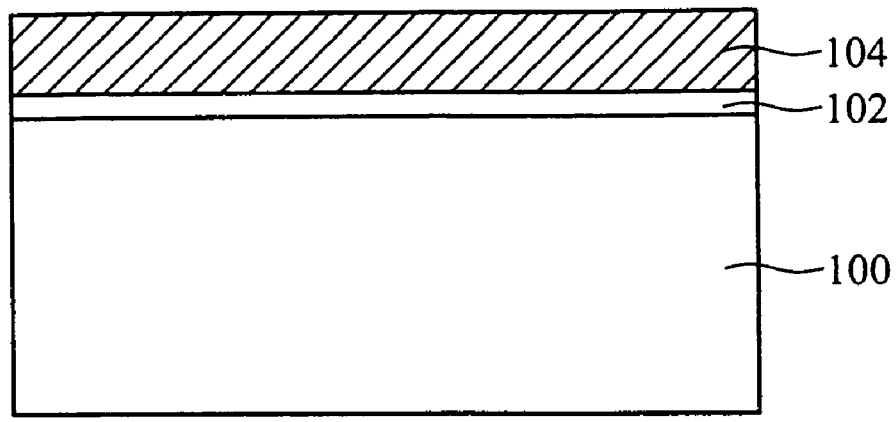
FIGS. 1a, 1b, 1c, 1c', 1d, and e are cross-sections showing a method for fabricating a semiconductor device having a stacked-gate structure of the invention.
Figure 1B:
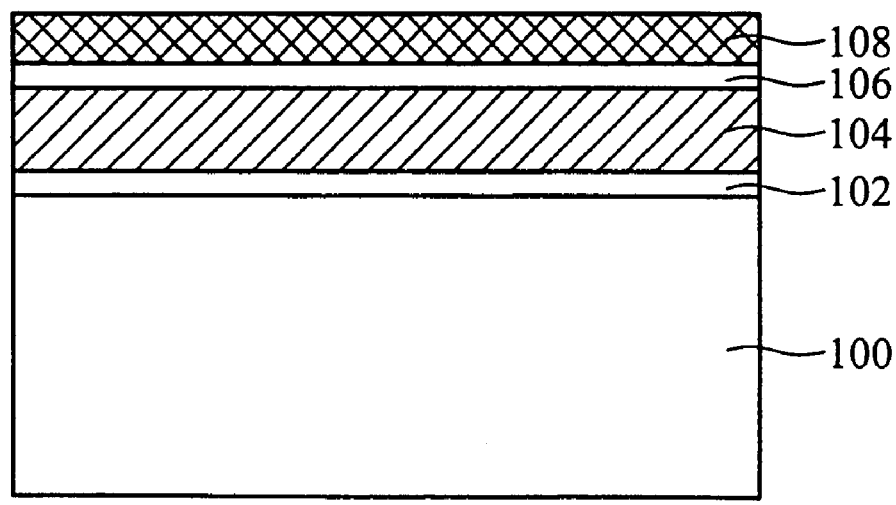

Next, in FIG. 1b, a thin conductive layer 106, such as a metal-flash layer, is formed overlying the polysilicon layer 104 to serve as a self-align silicide (SALICIDE) layer between the polysilicon layer 104 and a subsequent metal nitride layer. Here, the metal-flash layer 106 has a thickness of about 10 to 30 Å and can be a $TiSi_2$, $CoSi_2$, or NiSi layer, which is formed by self-aligned silicide (SALICIDE) process. Thereafter, a metal diffusion barrier layer 108 is formed overlying the thin metal layer 106 by conventional deposition, such as CVD or PVD. In the invention, the metal diffusion barrier layer 108 can be a tungsten nitride (WN) layer formed by PVD, which has a thickness of about 30 to 100 Å.

Figure 1C:
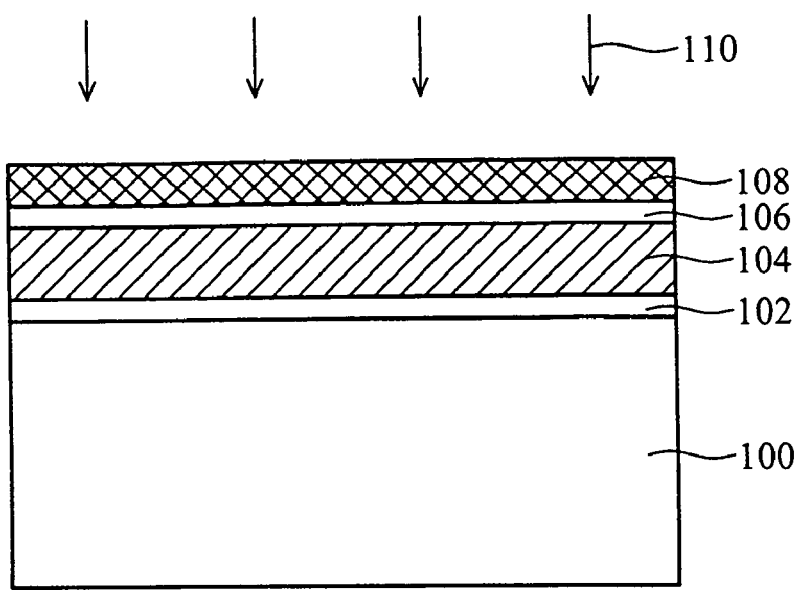
Figure 1C:
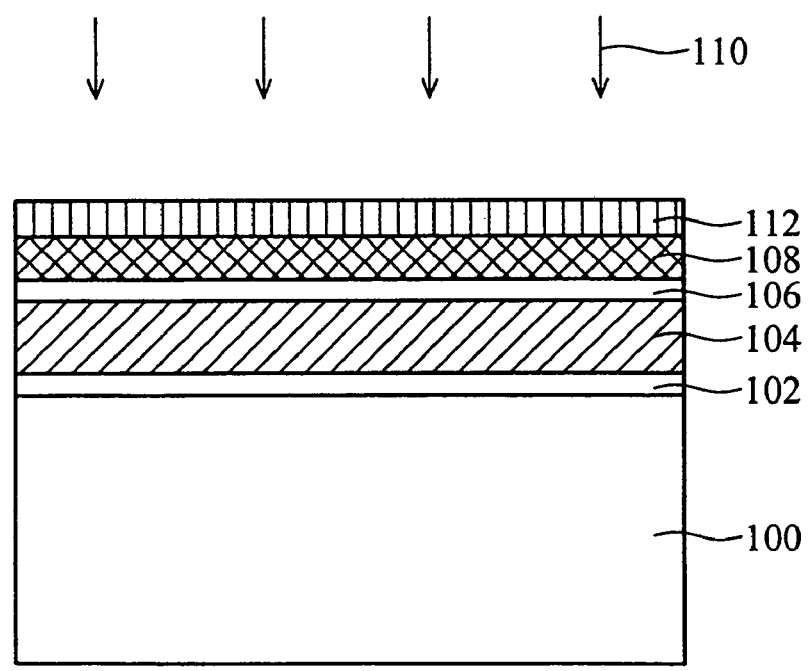

Next, in FIG. 1c, annealing 110 is performed on the tungsten nitride layer 108, which is the critical step of the invention, to improve the thermal stability of the tungsten nitride layer 108. In the invention, annealing 110 is performed using nitrogen ($N_2$) and hydrogen ($H_2$) gases at 800 to 1000° C. for 50 to 100 sec. Here, the flow ratio of nitrogen to hydrogen is about 4:1 to 3:2.

Figure 1D:
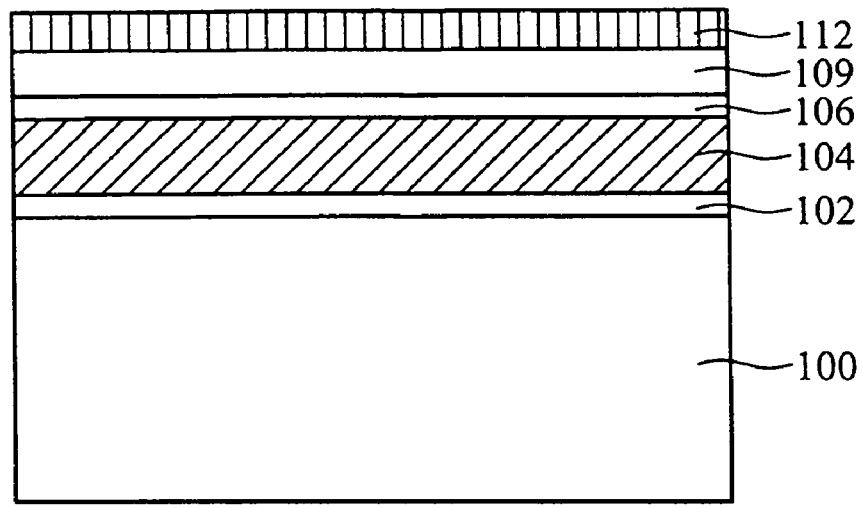

Next, in FIG. 1d, a tungsten layer 112 is formed overlying an annealed tungsten nitride layer 109, which has a thickness of about 200 to 1000 Å, to serve the material of the stacked-gate structure.

In addition, FIG. 1c' is a cross-section showing another example of fabricating the stacked-gate structure of the invention. In FIG. 1c', after the tungsten nitride layer 108 is formed, a tungsten layer 112 is subsequently formed thereon by PVD. Thereafter, the annealing 110 is performed on the tungsten layer 112 and the tungsten nitride layer 108. The thermal stability of the tungsten nitride layer 108 can also be improved and the resistance of the tungsten layer 112 can be reduced.

Figure 1E:
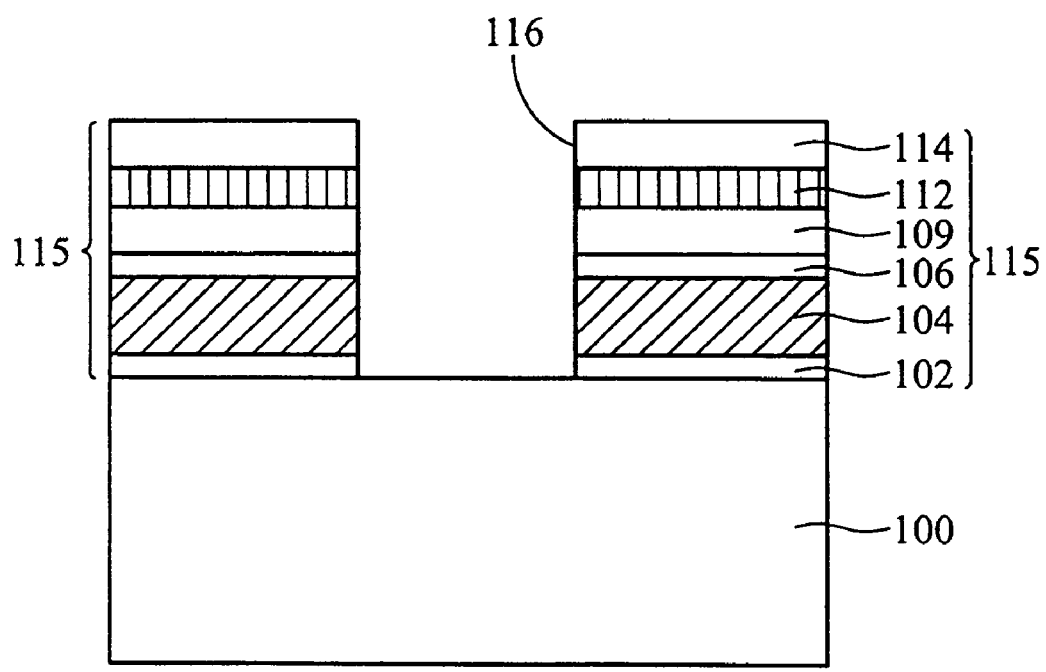

Finally, in FIG. 1e, a cap layer 114, such as silicon nitride, is formed overlying the tungsten layer 112 by conventional deposition, such as low-pressure CVD (LPCVD), to serve as a protective layer and a hard mask for defining stacked-gate structure. Next, a photoresist pattern layer (not shown) is formed on the cap layer 114 by lithography. Thereafter, the cap layer 114 is etched using the photoresist pattern layer as an etch mask to form an opening 116 therein. The photoresist pattern layer is then removed by ashing or a suitable solution. Next, the tungsten layer 116, tungsten nitride layer 109, the metal-flash layer 106, the polysilicon layer 104, and the gate dielectric layer 102 are successively etched using the cap layer 114 as a hard mask through the opening 116 to complete the fabrication of the stacked-gate structure 115.

In the fabrication of a stacked-gate structure according to the invention, annealing is performed using nitrogen and hydrogen gases after the tungsten nitride layer is formed, which can increase thermal stability and reduce resistance of the stacked-gate structure, thereby increasing device reliability.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for fabricating a semiconductor device having a stacked-gate structure, comprising the steps of:
    forming a polysilicon layer overlying a substrate, insulated from the substrate by a dielectric layer;
    forming a metal-flash layer overlying the polysilicon layer;
    forming a tungsten nitride layer overlying the metal-flash layer;
    forming a tungsten layer overlying the tungsten nitride layer; and
    annealing the tungsten layer and the tungsten nitride layer using nitrogen and hydrogen gases and at a temperature of more than 800° C.

2. The method as claimed in claim 1, further forming a cap layer overlying the tungsten layer.

3. The method as claimed in claim 1, further cleaning the surface of the polysilicon layer.

4. The method as claimed in claim 3, wherein the surface of the polysilicon layer is cleaned with diluted hydrofluoric acid.

5. The method as claimed in claim 1, wherein the metal-flash layer is formed by self-aligned silicide (SALICIDE) process.

6. The method as claimed in claim 5, wherein the metal-flash layer has a thickness of about 10 to 30 Å.

7. The method as claimed in claim 5, wherein the metal-flash layer comprises Ti, Co, or Ni.

8. The method as claimed in claim 1, wherein a flow ratio of nitrogen to hydrogen is about 4:1 to 3:2.

9. The method as claimed in claim 1, wherein the tungsten layer and the tungsten nitride layer are annealed for 50 to 100 sec.

* * * * *